United States Patent
Nakabayashi (10) Patent No.: US 8,487,328 B2
(45) Date of Patent: Jul. 16, 2013

(54) LIGHT EMITTING DEVICE

(75) Inventor: Takuya Nakabayashi, Tokushima (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 13/498,493

(22) PCT Filed: Sep. 27, 2010

(86) PCT No.: PCT/JP2010/066701
§ 371 (c)(1),
(2), (4) Date: Mar. 27, 2012

(87) PCT Pub. No.: WO2011/040372
PCT Pub. Date: Apr. 7, 2011

(65) Prior Publication Data
US 2012/0181574 A1  Jul. 19, 2012

(30) Foreign Application Priority Data
Oct. 1, 2009 (JP) ................................. 2009-229187

(51) Int. Cl.
*H01L 33/00* (2010.01)
(52) U.S. Cl.
USPC .................. 257/97; 257/99; 257/E33.066
(58) Field of Classification Search
USPC ....................... 257/97, 99, E33.066
See application file for complete search history.

(56) References Cited

U.S. PATENT DOCUMENTS

| 6,180,962 B1 * | 1/2001 | Ishinaga .......................... 257/99 |
| 6,249,049 B1 | 6/2001 | Kamada et al. |
| 6,355,946 B1 * | 3/2002 | Ishinaga .......................... 257/98 |
| 8,027,553 B2 | 9/2011 | Takai et al. |
| 2004/0012964 A1 | 1/2004 | Makuta |
| 2008/0310854 A1 | 12/2008 | Takai et al. |
| 2011/0108866 A1 * | 5/2011 | Lee et al. ........................ 257/98 |

FOREIGN PATENT DOCUMENTS

| JP | H02-36073 U | 3/1990 |
| JP | 2000-12728 A | 1/2000 |
| JP | 2003-324214 A | 11/2003 |
| JP | 2006-303388 A | 11/2006 |
| JP | 2008-53423 A | 3/2008 |

* cited by examiner

Primary Examiner — David Vu
Assistant Examiner — Brandon Fox
(74) Attorney, Agent, or Firm — Global IP Counselors, LLP (57) ABSTRACT

A light emitting device includes a semiconductor package, and a mounting board having first and second wiring components respectively connected to first and second conduction members of the semiconductor package. The semiconductor package includes: a light emitting element; a first conduction member, on one side of which the light emitting element is placed; and a second conduction member whose surface area is smaller than that of the first conduction member, the other side of the first and second conduction members forms the lower face of the semiconductor package. The mounting board includes: a narrow part and a wide part wider than the narrow part, which are formed on the first and second wiring components. At least the narrow part is joined to the first and second conduction members, and the first wiring component has a recess in its interior.

15 Claims, 8 Drawing Sheets

LIGHT EMITTING DEVICE

CROSS-REFERENCE TO RELATED APPLICATIONS

This national phase application claims priority to Japanese Patent Application No. 2009-229187 filed on Oct. 1, 2009. The entire disclosure of Japanese Patent Application No. 2009-229187 is hereby incorporated herein by reference.

TECHNICAL FIELD

The present invention relates to a light emitting device, and more particularly relates to a light emitting device in which a semiconductor package and a mounting board are connected by a joining member.

BACKGROUND ART

As electronic devices have become smaller and more lightweight in recent years, various light emitting devices (light emitting diodes), light receiving devices (CCD), and other such semiconductor packages installed in these have been developed to be smaller in size. These semiconductor packages have a structure in which, for example, a light emitting element, a light receiving element, or another such semiconductor package is joined and mounted on a mounting board having a pair of wiring patterns formed on insulated boards, and wires or the like are used to electrically connect the semiconductor package with the wiring patterns. These are installed in various devices, such as backlights for liquid crystal display devices.

When a semiconductor package used in such applications or the like is mounted on a mounting board, in particular the light emitting face or the incident face of a surface emitting or surface incident type of semiconductor package or the like must be mounted so that this face is horizontal and there is no misalignment to the mounting board surface.

In view of this, when a semiconductor device equipped with a convex bump electrode on its lower face is surface mounted, a ring-shaped recess is formed in the wiring on the mounting board side to match the shape of the convex bump electrode, and the convex and concave shapes are aligned and joined to produce a semiconductor device (see JP-2008-53423-A, for example). With the semiconductor device disclosed in JP-2008-53423-A, reflowed solder is puddled in the wiring recess, which takes up any variance in the amount of solder between the bump electrode and the wiring, and results in a more accurate solder joint in the semiconductor device.

Also, a mounting board in which a mounted part can be accurately soldered to the specified location by varying the shape of the wiring of the mounting board, for example, has been proposed (see JP-2006-303388-A, for example).

SUMMARY

Figure 9:
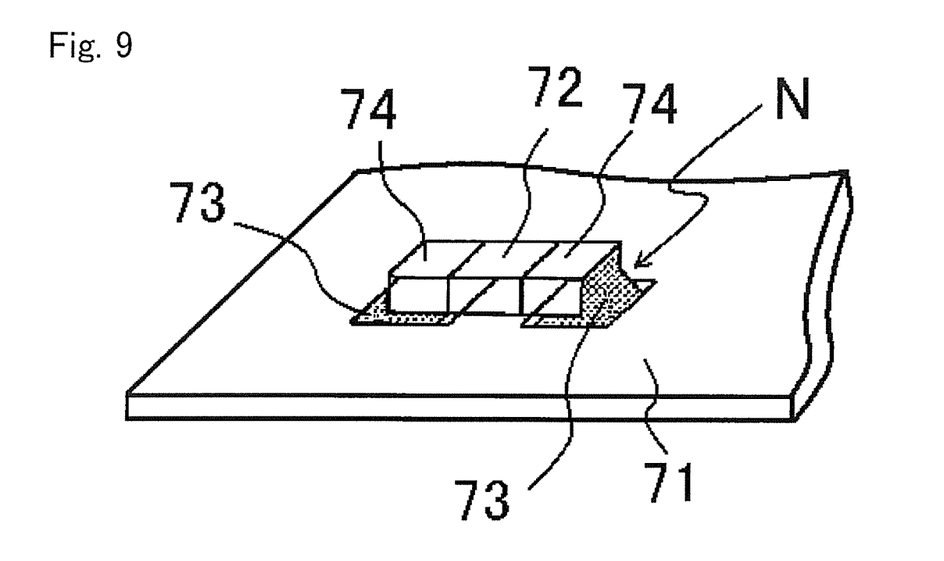
FIG. 9 is a simplified oblique view of the state when a conventional mounted part has been joined to a mounting board.

In general, when a mounted part is soldered to the wiring component of a mounting board, as shown in FIG. 9, excess solder 73 that has been reflowed at the ends of a mounted part 72 on a mounting board 71 creeps up along the side faces toward electrodes 74 of the mounted part 72 (N in FIG. 9), which achieves a fine balance in the amount of solder under the pair of electrodes 74 of the mounted part 72. Therefore, any variance in the amount of solder that is attributable to these shapes is absorbed even at wiring component with a concave shape, a T shape, etc., in the above-mentioned prior art.

However, with a surface mount type of lead-less semiconductor package in which an extremely compact size has been attained, when soldering to the mounting board, as the solder flows, there is almost none of the upward creep of solder along the electrodes on the side faces, as shown by the above-mentioned N in FIG. 9, caused by puddling or leaking of excess solder when the wiring pattern on the mounting board side is utilized. Thus, once again misalignment occurs, there is a height difference between the electrodes, and accurate mounting is difficult.

In particular, with a super-compact semiconductor package, misalignment or a tiny height difference between the electrodes can have a very pronounced effect on the direction in which the light is emitted.

Also, even with a super-compact semiconductor package, good performance and a long service life need to be ensured, by improving the heat dissipation when the package is mounted.

The present invention was conceived in light of the above problems, and it is an object thereof to provide a light emitting device with which a small, lightweight semiconductor package can be mounted with high accuracy on a mounting board.

The light emitting device according to one aspect of the present invention is such that a semiconductor package includes a light emitting element, a first conduction member, on one side of which the light emitting element is placed, and a second conduction member whose surface area is smaller than that of the first conduction member, the other side of the first conduction member and the second conduction member, on the opposite side from said one side, forms a lower face of the semiconductor package, and a mounting board connected with the semiconductor package by a joining member, the mounting board including a first wiring component including a narrow part and a wide part wider than the narrow part and extending away from the first conduction member, at least the narrow part of the first wiring component being joined to the first conduction member, and the first wiring component having a recess in its interior, a second wiring component including a narrow part and a wide part wider than the narrow part and extending away from the second conduction member, at least the narrow part of the second wiring component being joined to the second conduction member.

Such light emitting device is preferably provides with at least one of followings.

The recess is formed in the wide part of the first wiring component at a position adjacent to the narrow part and in a center region with respect to a width direction.

The recess is formed in the wide part of the first wiring component as a through-hole that passes through the first wiring component.

An insulator layer is disposed on a bottom of the recess formed in the first wiring component.

The semiconductor package has the light emitting element and a sealing member that covers at least one side of the first conduction member and the second conduction member, and the one side and the other side of the first conduction member and second conduction member are exposed from the sealing member only at the lower face of the semiconductor package.

Each of the first conduction member and second conduction member has a cut-out such that a part of one end of the cut-out coincides with a side face of the semiconductor package, and the other part of the one end of the cut-out is disposed to an inside of the side face of the semiconductor package.

A width of the narrow part of the first wiring component and a width of the narrow part of the second wiring component of the mounting board are less than a width of the semiconductor package, and a width of the wide part of the first wiring component and a width of the narrow part of the second wiring component are greater than the width of the semiconductor package.

A width of the narrow part of the first wiring component and a width of the narrow part of the second wiring component of the mounting board are the same or less than a width of the first and second conductive members of the semiconductor package.

A recess is formed in an interior of the second wiring component of the mounting board.

The recess is formed in the interior of the second wiring component as a through-hole that passes through the second wiring component.

An insulator layer is disposed on a bottom of the recess formed in the second wiring component.

A volume of the recess formed in the first wiring component of the mounting board is larger than a volume of the recess formed in the second wiring component.

A side face of the semiconductor package is disposed above the recess in the first wiring component.

The first and second conduction members are composed of plating films.

A thickness of each of the first and second conduction members is 0.5 mm or less.

A light emitting device in which a small, lightweight semiconductor package is mounted with high accuracy on a mounting board can be obtained with the present invention.

DETAILED DESCRIPTION OF THE PREFERRED EMBODIMENTS

A preferable mode for working the present invention will now be described through reference to the drawings. The mode discussed below, however, is just an example of a light emitting device that embodies the technological concept of the present invention, and the present invention is not limited to or by the following. In particular, unless otherwise specified, what is described in the various embodiments can be directly applied to other embodiments as well.

Also, this Specification does not specify that the members given in the Claims be the members in the embodiment. In particular, the dimensions, materials, shapes, relative layouts, and so forth of the constituent parts discussed in the embodiments are not intended to limit the scope of the present invention unless specifically stated so, and are nothing but illustrative examples.

The size, positional relations, and so forth of the members shown in the drawings may be exaggerated to make the description clear.

Furthermore, in the following description, names and numbers that are the same refer to the same or analogous members, and such members will not be described in detail again.

Embodiments

Figure 1A:
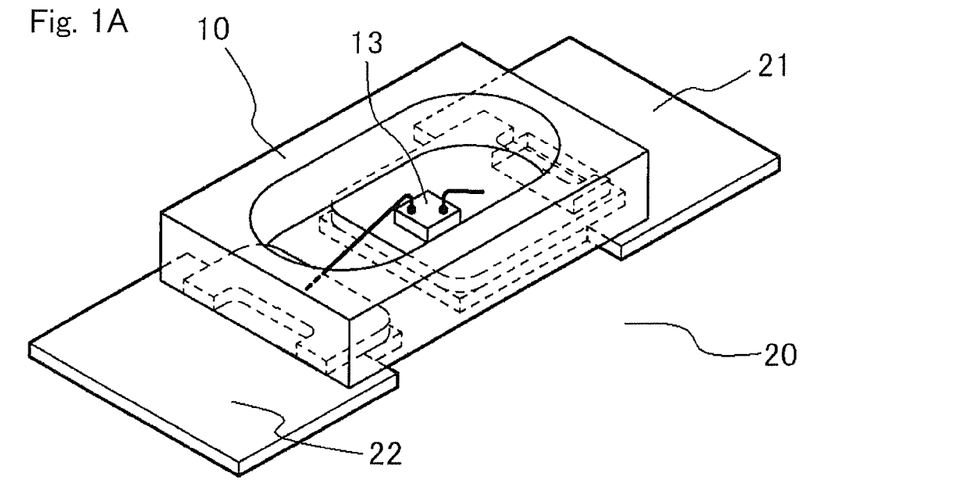
FIG. 1A is an oblique view of a light emitting device, for illustrating how the mounting board and the semiconductor package of the present invention are connected.
Figure 1B:
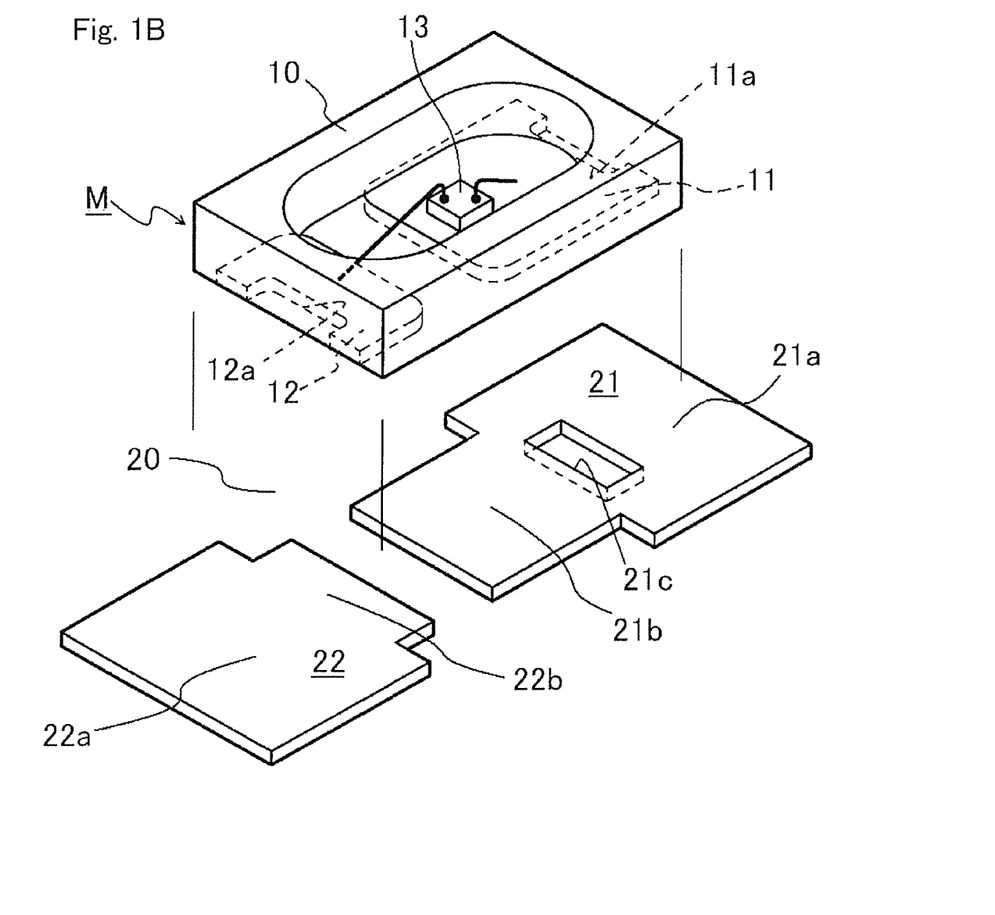
FIG. 1B is an exploded oblique view of a light emitting device, for illustrating how the mounting board and the semiconductor package of the present invention are connected.

As shown in FIGS. 1A and 1B, the light emitting device of the present invention includes portions where a semiconductor package 10 and a mounting board 20 are joined.

Semiconductor Package 10

As shown in FIGS. 1A, 1B, and 2A to 1D, the semiconductor package comprises at least a light emitting element 13, a first conduction member 11 on one side of which (such as the front face) the light emitting element 13 is mounted, and a second conduction member 12.

Usually, a sealing member that covers at least one side of the first conduction member 11 and the second conduction member 12 is provided along with the light emitting element 13. The sealing member is generally formed by a sealing resin 14 that integrally seals the first and second conduction members 11 and 12, and a translucent covering resin 15 that covers the light emitting element 13 and part of one side of the first conduction member 11 and the second conduction member 12.

First Conduction Member 11/Second Conduction Member 12

The light emitting element 13 is placed on the first conduction member 11, and the first conduction member 11 functions as an electrode for sending power to the light emitting element 13. The second conduction member 12 is isolated from the first conduction member 11, is disposed facing the first conduction member 11, and functions as an electrode for sending power to the light emitting element.

The light emitting element 13 is placed on, or electrically connected with, one side (that is, the front face or the top face) of the first and second conduction members 11 and 12, and the side on the opposite side from the one side (that is, the rear face) forms the outer surface of the semiconductor package 10 (such as the lower face or the rear face). In other words, the one side (the light emitting element placement region) and the other side of the first and second conduction members 11 and 12 are not present on the side faces of the semiconductor package, the one side and the other side are exposed from the sealing member only at the lower face of the semiconductor package, or the one side and the other side of the first and second conduction members 11 and 12 are not exposed from the sealing member at the side faces of the semiconductor package 10, and only exposed from the sealing member at part of the side face of the first and second conduction members 11 and 12 (namely, the portion corresponding to the thickness of the first and second conduction members).

To put this another way, this means that the first and second conduction members curve from the extension direction, and the one side and other side (front and rear faces) thereof are not present at the side face of the sealing member.

Usually, the light emitting element 13 is disposed near the center of the semiconductor package 10, so the first conduction member 11 extends to near the center from the side face of the semiconductor package 10, and the light emitting element 13 is disposed near the center of the semiconductor package 10. The second conduction member 12 is disposed on the side-face side of the light emitting element 13, opposite the first conduction member 11, and is smaller than the first conduction member 11 (the surface area, that is, the surface area of the one side and the other side) by an amount equal to the area where the light emitting element 13 is placed.

There are no particular restrictions on the difference in size between the first conduction member 11 and the second conduction member 12, which can be suitably set according to the size of the semiconductor package, the size of the light emitting element 13, and so forth. The first conduction member 11 may have a surface area at least large enough to allow placement of the light emitting element 13. The second conduction member 12 may have a surface area at least large enough to allow wire bonding with the electrodes of the light emitting element 13.

The first conduction member and the second conduction member can have any of a variety of shapes in plan view, such as an approximate square, a polyhedron, a shape having a cut-out in one of these shapes, or the like.

The region of the first conduction member 11 on which the light emitting element 13 is placed is preferably a flat face. The upper faces of the first conduction member 11 and the second conduction member may have tiny bumps, grooves, holes, or the like, except in the region where the light emitting element 13 is placed. It is preferable if the lower faces of these members are substantially flat faces on the outer surface of the semiconductor package, but tiny bumps or the like may be formed. However, it is favorable for the first and second conduction members 11 and 12 to be in substantially the same plane as the lower face of the sealing member (discussed below), that is, to be in substantially the same plane as the lower face of the semiconductor package.

The first conduction member 11 and the second conduction member 12 have different sizes as mentioned above, but it is favorable for their widths (W in FIG. 2A) to be substantially the same, and for their lengths (L in FIG. 2A) to be different.

Figure 2A:
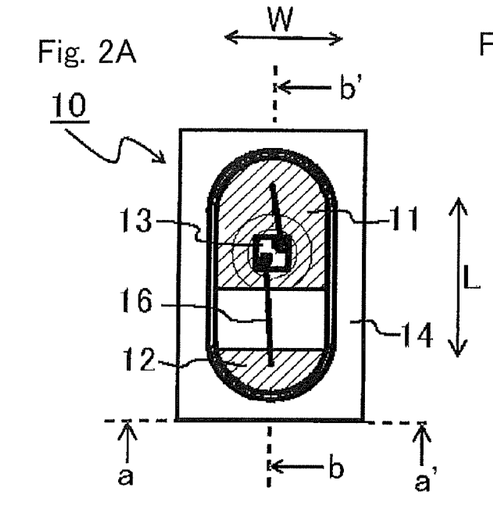
FIG. 2A is a plan view of the semiconductor package of the present invention, 2B is a side view on the a-a' side, 2C is a cross section along the b-b' line, 2D is a bottom view, and 2E is a partial enlarged view.
Figures 2B, 2E:
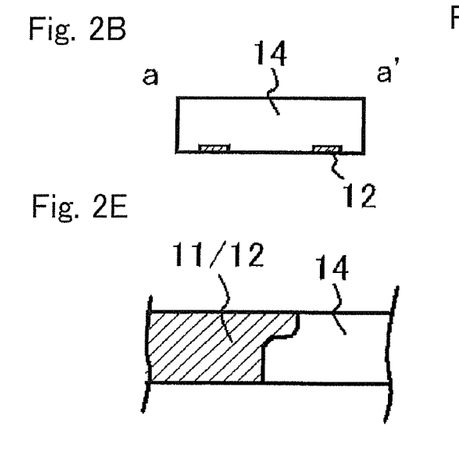
Figure 2C:
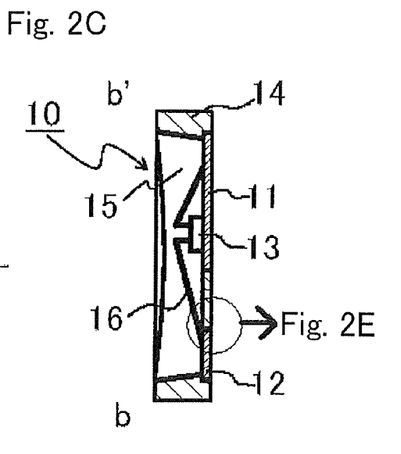
Figure 2D:
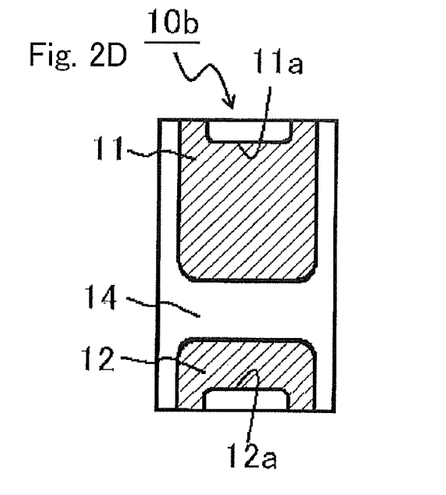

In particular, as shown in FIGS. 2A to 2D, it is preferable if the semiconductor package 10 is substantially square, the side faces of the first and second conduction members 11 and 12 are not exposed (FIG. 2D) at one pair of the side faces of the semiconductor package 10 (such as the short-ways direction in FIG. 2D), and part of the side faces of the first and second conduction members 11 and 12 is exposed at the other pair of side faces (such as the lengthwise direction in FIG. 2D) (see FIGS. 2B and 2C). The shape of the first and second conduction members 11 and 12 in this case is preferably such that cut-outs 11a and 12a are formed at locations corresponding to the other pair of side faces. That is, part of these cut-outs 11a and 12a coincides with the side faces of the semiconductor package at one end of the first conduction member and second conduction member, and the other part of that one end (such as the middle portion) is disposed to the inside of the side faces of the semiconductor package. Therefore, part of the first and second conduction members corresponding to the thickness is exposed from the sealing member at the lower side of the other pair of side faces of the semiconductor package. This exposure may be one at one side face, but two are usually better (see the face M in FIG. 1B).

There are no particular restrictions on the width and length of the cut-outs, which can be suitably set according to the size of the first and second conduction members, etc. For example, the width may be about 5 to 80% width of the first and second conduction members, and the length about 10 to 70% length of the second conduction member.

The presence of these cut-outs 11a and 12a better ensures good contact area of the side faces with the sealing resin as discussed below, which prevents separation between the sealing resin and the first and second conduction members 11 and 12.

In the manufacture of the semiconductor package 10 as discussed below, a plurality of semiconductor packages 10 are sealed all at once, after which they are split into individual semiconductor packages 10, and the locations where the slicing blade slices the first and second conduction members themselves can be kept to a minimum, so the splitting can be carried out more easily.

Figure 3A:
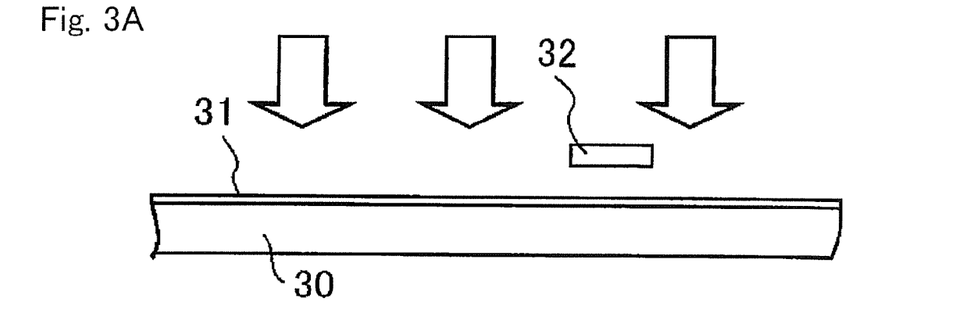
FIG. 3 is a step diagram illustrating a method for manufacturing the semiconductor package of the present invention.
Figure 3B:
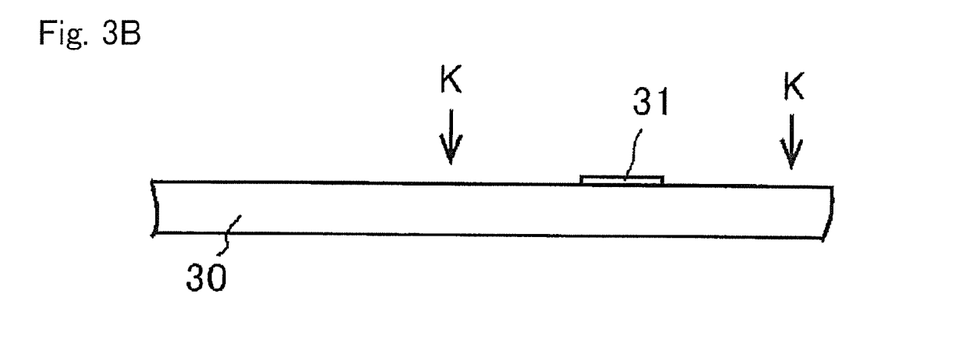
Figure 3C:
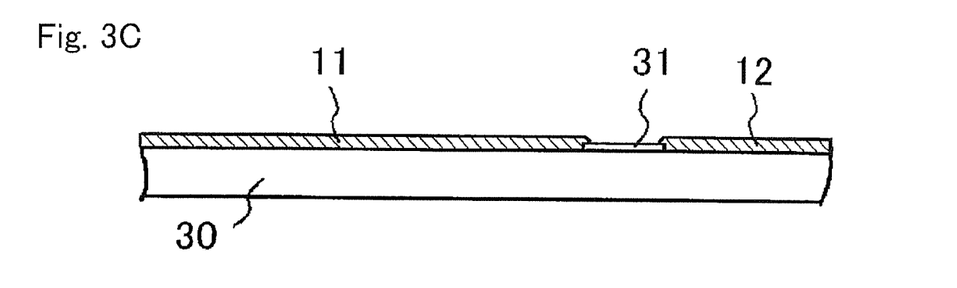
Figure 3D:
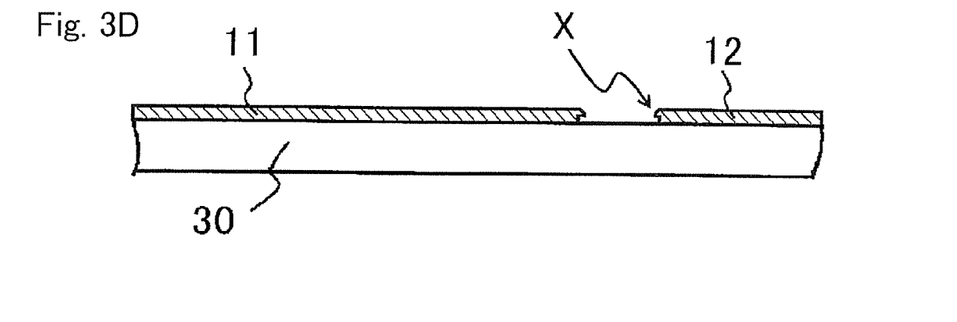

The side faces of the first and second conduction members 11 and 12 may themselves be either flat or curved surfaces, but when adhesion to the sealing resin as discussed below and other such factors are taken into account, it is preferable for these side faces to have a shape with a protruding part X as shown in FIGS. 2E and 3D. The protruding parts X can be provided at any locations around the first and second conduction members 11 and 12. For instance, they may be provided partially, such as only on the two opposing side faces of the first and second conduction members 11 and 12 that are square in top view, but preferably they are formed all the way around. The protruding parts X are formed only on the upper side in FIGS. 2E and 3D, but may be provided on the lower side, or on both the lower and the upper sides. This effectively prevents falling out of the sealing resin.

The first and second conduction members may be formed from different materials, but are preferably formed from the same material. This simplifies their manufacture.

Examples thereof include a metal such as copper, aluminum, gold, silver, tungsten, iron, nickel, cobalt, molybdenum or an alloy thereof (e.g., an iron-nickel alloy, phosphorus bronze, copper with iron, an Au—Sn eutectic solder, SnAgCu, SnAgCuIn solders or the like), and an oxide conductor (e.g., ITO or the like). The first and second conduction members may be a single-layer or a laminated structure of two or more layers.

In particular, the first and second conduction members are preferably composed of plating films, and may be laminated plating films. More specifically, the upper face (the side on which the light emitting element is placed) preferably has a high gloss and high reflectance, or is capable of reflecting light from the light emitting element, and gold, silver, copper, Pt, Pd, Al, W, Mo, Ru, Rh and the like are favorable. The lower face is preferably a plating film made of gold, tin, a tin alloy, eutectic solder of AuSn or the like, which are advantageous in mounting to a circuit board or the like.

The thickness of the first and second conduction members may be different from each other, but preferably the thickness is substantially the same. More specifically, about 500 Ξm or less is good, and particularly about 200 μm or less, with about 100 μm or less being even better. Also, about 25 μm or more is favorable. In particular, if the thickness is set to about 100 μm or less, this extremely small thickness, which cannot be used with conventional lead frames, affords a semiconductor package that is smaller and lighter.

Light Emitting Element

The light emitting element is constituted by a laminate of semiconductor layers in which positive and negative electrodes are formed on the same or different faces, and encompasses, for example, an element that also functions as a light emitting diode and a light receiving element.

A light emitting element of any wavelength can be selected. The composition (material and crystal mixture ratio of semiconductor layers), emission color (emission wavelength), size, number, and so forth of the light emitting elements can be suitably selected according to the objective.

A photo-IC, photodiode, phototransistor, CCD (charge coupled device) image sensor, CMOS image sensor, Cd cell or the like may be used as the light emitting element.

The light emitting elements, etc., may be used singly or in combinations of two or more types, and a protective element, etc., may be installed in addition to the light emitting elements.

Sealing Member

The sealing resin 14 that constitutes part of the sealing member includes a resin capable of blocking light from the light emitting element 13, and is disposed on the outer peripheral portion of the upper faces of the first and second conduction members 11 and 12 and between the first and second conduction members 11 and 12. Providing the opaque sealing resin 14 at this location prevents light from the light emitting element 13 from leaking to the outside from the lower face side of the semiconductor package 10, and improves the light extraction efficiency in the upper face direction. Also, the first and second conduction members 11 and 12 can be exposed at the outer surface on the lower face of the semiconductor package 10, and a smaller size and lighter weight can be achieved without resorting to a structure in which a lead protrudes from the rear face or horizontally as with a conventional lead frame, or resorting to a structure in which a protruding lead is curved and routed downward or to the side face.

There are no particular restrictions on the type of sealing resin 14, as long as it is capable of blocking light from the light emitting element, but one that reflects light from the light emitting element is preferable. For example, a thermosetting resin, a thermoplastic resin, or another such resin can be used. Examples thereof include an epoxy resin composition, a silicone resin composition, a modified-epoxy resin composition such as a silicone modified-epoxy resin, a modified-silicone resin composition such as an epoxy modified-silicone resin, a polyimide resin composition, a modified polyimide resin composition, an acrylic resin composition, and the like.

The resins mentioned in paragraphs 73 to 81 of Japanese Laid-Open Patent Application 2006-156704, such as a thermosetting resin (i.e., an epoxy resin, a modified-epoxy resin, a silicone resin, a modified-silicone resin, an acrylic resin, an urethane resin and the like), are particularly favorable. More specifically, it is preferable to use a solid epoxy resin composition including a colorless, transparent mixture obtained by dissolving and mixing an epoxy resin composed of triglycidyl isocyanurate or hydrogenated bisphenol A diglycidyl ether, and an acid anhydride composed of hexahydrophthalic anhydride, 3-methylhexahydrophthalic anhydride, or 4-methylhexahydrophthalic anhydride in an equivalent amount in the epoxy resin. A favorable example of the is a solid epoxy resin composition obtained by adding 0.5 parts by weight DBU (1,8-diazabicyclo(5,4,0)undecene-7) as a curing promoter, 1 part by weight ethylene glycol as an auxiliary catalyst, 10 parts by weight titanium oxide pigment, and 50 parts by weight glass fiber to 100 weight parts of the above mixture, heating this to bring about a partial curing reaction, and effecting B-stage conversion.

Also favorable is the thermosetting epoxy resin composition containing an epoxy resin that includes a triazine derivative epoxy resin, mentioned in paragraphs 23 to 52 of WO2007/015426.

A favorable example of a triazine derivative epoxy resin is a 1,3,5-triazine core derivative epoxy resin. An epoxy resin having an isocyanurate ring has particularly good light resistance and electrical insulating property, and preferably has a divalent, and more preferably a trivalent, epoxy group for one isocyanurate ring. More specifically, tris(2,3-epoxypropyl) isocyanurate, tris($\alpha$-methylglycidyl) isocyanurate, and the like can be used. The softening point of the triazine derivative epoxy resin is preferably 90 to 125° C. This triazine derivative epoxy resin may be used together with a hydrogenated epoxy resin or with another epoxy resin or the like. In the case of a silicone resin composition, a silicone resin that includes methyl silicone resin is preferable.

When a triazine derivative epoxy resin is used, it is preferable to use an acid anhydride that acts as a curing agent. Light resistance can be improved by using an acid anhydride that is non-aromatic and does not have any carbon-carbon double bonds. Examples include hexahydrophthalic anhydride, methylhexahydrophthalic anhydride, trialkyltetrahydrophthalic anhydride, hydrogenated methylnadic anhydride and the like. Methylhexahydrophthalic anhydride is particularly favorable.

The use of an antioxidant is preferable. This antioxidant can be a phenol-based or a sulfur-based antioxidant, for example. Any curing agent that is known in this field can be used.

Various additives can be added as needed to these resins. Microparticles of $TiO_2$, $SiO_2$, $Al_2O_3$, MgO, $MgCO_3$, $CaCO_3$, $Mg(OH)_2$, $Ca(OH)_2$, or the like can be used as a filler in the sealing resin 14. These may be used singly or in combinations of two or more types. Using one of these fillers allows the optical transmissivity to be adjusted. For example, it can be adjusted so that approximately 60% or more of the light from the light emitting element is blocked, and preferably approximately 90% is blocked.

The thickness of the sealing resin 14 may be enough to prevent the leakage of light toward the lower face side of the semiconductor package 10, and enough to allow light to be reflected toward the upper face side. For example, the thickness may be at least equivalent to the height when the light emitting element 13 has been wire-bonded, in addition to the thickness of the first and second conduction members.

The sealing member comprises the translucent covering resin 15, which covers the light emitting element 13 on the upper face of the first and second conduction members 11 and 12 and protects a light emitting element, a light receiving element, a protective element, and the conductive wires and other such electronic parts associated with these, from dust, moisture, external force, and so on.

The translucent covering resin 15 is preferably translucent to the light from the light emitting element, and has light resistance and is insulating. Specific examples thereof include a silicone resin composition; a modified-silicone resin composition; an epoxy resin composition; a modified-epoxy resin composition; an acrylic resin composition; and a hybrid resin composition containing at least one of a silicone resin, an epoxy resin composition, an urea resin and a fluorocarbon resin; an inorganic compound such as a glass, a silica sol or the like; or the like.

The translucent covering resin 15 may contain a colorant, a light diffuser, various kinds of filler, a wavelength conversion material (such as a fluorescent), or the like.

The translucent covering resin 15 may contain a fluorescent that absorbs at least part of the light from the light emitting element 13 and emits light having a different wavelength.

The fluorescent may be one that converts light from a semiconductor light emitting element to a shorter wavelength, but from the standpoint of light takeoff efficiency, it preferably converts to a longer wavelength. The fluorescent may be a single layer containing one type of fluorescent, a single layer in which two or more types of fluorescent are mixed, a laminate of two or more layers in which two or more types of fluorescent are contained in separate layers, or a laminate of two or more single layers in which two or more types of fluorescent substance or the like are mixed.

Favorable examples of fluorescents include nitride-based fluorescents and oxy-nitride-based fluorescents that are mainly activated by europium, cerium, and other such lanthanoid elements. More specifically, examples is preferably at least one selected from a group comprising of (a) α or β sialon type fluorescents, various alkaline earth metal silicon nitride fluorescents, various alkaline earth metal aluminum silicon nitride fluorescents that are mainly activated by europium, (b) alkaline earth metal halogen apatite fluorescents, alkaline earth halo silicate fluorescents, alkaline earth metal silicate fluorescents, alkaline earth metal boric acid halogen fluorescents, alkaline earth metal aluminate fluorescents, alkaline earth metal silicate, alkaline earth metal sulfide, alkaline earth metal thiogallate, alkaline earth metal silicon nitride, germinate that are mainly activated by europium or other such lanthanoid elements, or manganese or other such transition metal elements, (c) rare earth aluminate, rare earth silicate, alkaline earth metal rare earth silicate that are mainly activated by cerium or other such lanthanoid elements, (d) organic compound, organic complex that are mainly activated by europium or other such lanthanoid elements.

The translucent covering resin 15 may be a single-layer structure or a laminated structure.

There are no particular restrictions on the shape of the translucent covering resin 15, as long as the shape completely covers the light emitting element, the wires, etc. When light distribution characteristics and so forth are taken into account, the upper face may have a convex lens shape, a concave lens shape, a Fresnel lens shape, or the like, or a lens-shaped member may be provided separately.

Also, a fluorescent may be contained in all or part of the translucent covering resin 15 and a flat, domed, or other such shape produced, or a flat or domed member may be provided separately. Examples include glass, a resin composition, or the like that has been molded and coated with a fluorescent; a fluorescent-containing glass; a YAG sinter; a sinter of YAG and $Al_2O_3$, $SiO_2$, $B_2O_3$, or the like; and a fluorescent-containing molded article such as a crystallized inorganic bulk material obtained by precipitating YAG in an inorganic melt.

Connecting Member

The semiconductor package used in the present invention has a light emitting element placed on a first and/or second conduction member, and a connecting member is used to connect these. The connecting member may be a conductive connecting member or an insulating connecting member. For example, when the board of a light emitting element is an insulated board, or more specifically, with a semiconductor light emitting element in which a nitride semiconductor layer is laminated over sapphire, the joining member may be either insulating or conductive. In the case of an SiC board or other such conductive board, power conduction can be achieved by using a conductive joining member.

The insulating connecting member can be an epoxy resin composition, a silicone resin composition, a polyimide resin composition or a modified resin, a hybrid resin thereof, or the like. When these resins are used, if we take into account degradation caused by light or heat from the semiconductor light emitting element, it is preferable to provide a dielectric reflective film and/or a metal layer with high reflectance, such as an aluminum or silver film, on the rear face of the light emitting element.

The conductive connecting member can be a conductive paste of silver, gold, palladium, or the like, a solder such as eutectic Au—Sn, a braze of a low-melting point metal, or another such material.

Of these connecting members, particularly when a translucent connecting member is used, it may contain a fluorescent member that absorbs light from the semiconductor light emitting element and emits light of a different wavelength.

Conductive Wire

With the semiconductor package used in the present invention, the conductive wires electrically connect the electrodes of the light emitting element with the first and second conduction members. Wires made from gold, silver, copper, platinum, aluminum, or another such metal, or alloys of these, are usually used. The use of gold is particularly favorable because of its excellent heat resistance, etc.

Method for Manufacturing Semiconductor Package

The first conduction member and second conduction member of the semiconductor package of the present invention may be produced using any lead frame that is commonly used, but as mentioned above, a plating film is preferable in order to save weight and achieve a super-compact size.

Therefore, the semiconductor package can be produced using the following method, for example.

First, as shown in FIG. 3A, a support substrate 30 is prepared.

Support Substrate

The support substrate is a board- or sheet-shaped member used to form the first and second conduction members, and since it is removed before the individual semiconductor packages are separated, it is a member that does not constitute a part of the semiconductor package.

There are no particular restrictions on the support substrate, but preferably it is conductive. Examples include a metal board made of stainless steel, iron, copper, silver, kovar, nickel, or the like, the product of forming a conductive film by sputtering, vapor deposition, or the like on an insulating substrate such as a polyimide, and an insulating substrate to which a conductive film or the like can be affixed.

Since the support substrate is removed in the final stage of the process, it is preferable to use a material that is easy to bend. Also, the support substrate surface is preferably smooth in order to increase the surface gloss of the first and second conduction members that are formed. For example, when stainless steel is used as the support substrate, it is good to use a type in the SUS 300 series (such as 302), which has a relatively small crystal grain boundary. If high dimensional precision is required, it is preferable to use a material from the 400 series, which has a low coefficient of linear expansion. An example of the film thickness is about 10 to about 300 μm. Slits, grooves, or undulations may be made in order to reduce warping after formation caused by the resin as discussed below.

The surface of the support substrate is coated with a resist 31. The thickness of the first and second conduction members that are formed subsequently can be adjusted by varying the thickness of this resist 31. For example, the thickness of the resist 31 can be about 10 to about 200 μm, such as 100 μm. Here, the resist 31 is provided only to the upper face of the support substrate 30 (the face where the first conduction member and so forth are formed), but may be formed o the lower face (the face on the opposite side). In this case, if the resist is formed over substantially the entire face on the opposite side, this will prevent the conductive members from being formed on the lower face when the first and second conduction members are formed by plating.

The resist 31 coating is then dried, a mask 32 having a plurality of mutually isolated openings is disposed directly or indirectly over this coating, and this product is exposed by being irradiated with ultraviolet rays as indicated by the arrows in the drawing.

After this, the product is treated with an etchant to form the resist 31 having the openings K as shown in FIG. 3B.

Next, plating is performed with a metal to form the first and second conduction members 11 and 12 in the openings K of the resist 31 as shown in FIG. 3C. The plating conditions can be adjusted to form protrusions X as shown in FIG. 2E if the plating is done in a thickness greater than the thickness of the resist 31.

An example of the first and second conduction members is a laminated structure consisting of a plating of Au—Cu—Ni—Ag from the support substrate 30 side. The plating conditions can be adjusted by suitably setting parameters known in this field.

First, pretreatment is performed with an acidic cleaner. This pretreatment is preferably performed between room temperature and about 50° C. A commercially available product can be used for the acidic cleaner. Examples of acid solutions include dilute sulfuric acid, dilute hydrochloric acid, and dilute nitric acid. Of these, dilute sulfuric acid is preferred.

Then, plating is performed over the support substrate in the order of Au—Cu—Ni—Ag. It is good for this plating to be performed between room temperature and about 75° C., for example.

The gold is formed for the sake of ease of mounting, since it will be the joining face as an electrode after the support substrate is peeled off. A film thickness of about 0.1 to about 1.0 µm is favorable, for example. Adhesion can be controlled by treatment with a strike bath prior to gold plating.

The nickel plating is preferably done with a sulfamic acid bath, which is excellent for low-stress, thick-film electroplating. A glossy film of about 5 to about 20 µm is preferably formed with an additive. The nickel film can also function as a mask in subsequent etching and a barrier that prevents copper diffusion.

The silver plating is preferably performed for a short time using a bath that can form films ranging from non-glossy to highly glossy. A film thickness of about 2 to about 5 µm is favorable.

The support substrate and the plating films are preferably rinsed with water and/or dried before and after each plating.

After plating, the resist 31 is washed off, forming the mutually isolated first and second conduction members 11 and 12 as shown in FIG. 3D.

Then, a second protective film (not shown) is formed on part of the upper faces of the first and second conduction members 11 and 12. This protective film can be formed using the same materials as the above-mentioned second protective film and patterning in the same way. The formation of this second protective film may, however, be omitted.

Figure 4A:
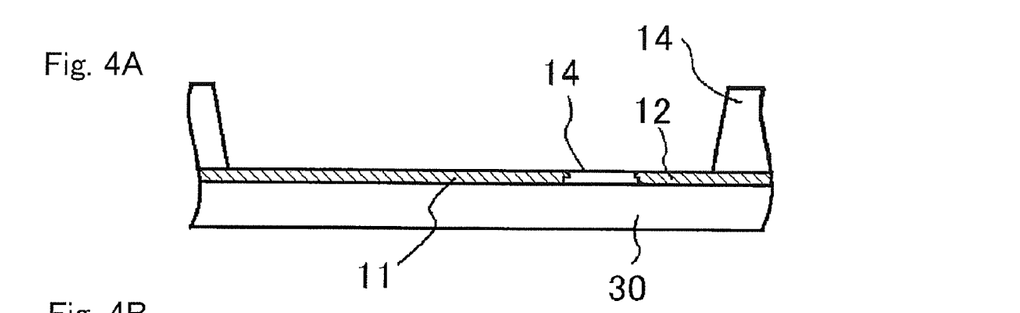
FIG. 4 is a continuation of the step diagram in FIG. 3.

As shown in FIG. 4A, this second protective film is used to form a sealing resin 14 over the first and second conduction members 11 and 12 and between the first and second conduction members 11 and 12.

The sealing resin 14 can be formed by heating an opaque thermosetting resin to lower its viscosity, and then forming by transfer molding or the like over the entire upper face of the support substrate 30 on which the first and second conduction members 11 and 12 have been formed. The heating temperature and time can be adjusted as desired.

The material that makes up the sealing resin 14 can be an epoxy resin composition, an epoxy-modified silicone resin composition, or a silicone resin composition containing $SiO_2$ as a filler and $TiO_2$ as a white pigment. It is also possible to add a parting agent to the resin to improve mold parting during molding, or a parting agent can be blown into the mold, or a parting sheet or the like can be used.

The second protective film is then removed. This removal of the second protective film can be performed in the same manner as the removal of the above-mentioned protective film.

Figure 4B:
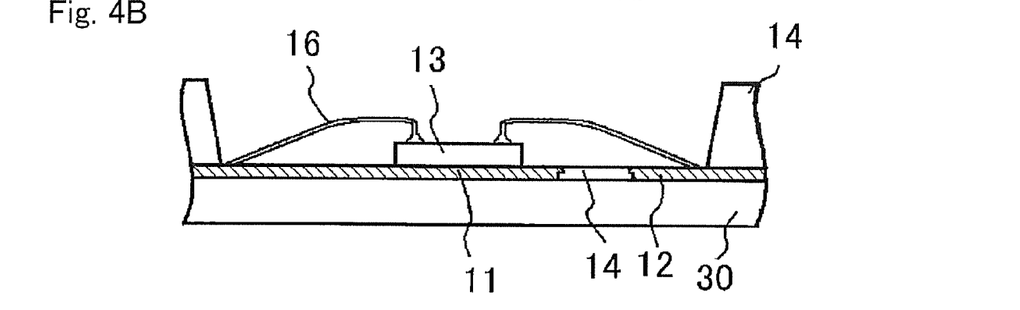

As shown in FIG. 4B, the light emitting element 13 is fixed on the first conduction member 11 in the region surrounded by the sealing resin 14, and the electrodes of the light emitting element 13 are bonded to the upper faces of the first conduction member 11 and the second conduction member 12 in the region surrounded by the sealing resin 14, using conductive wires 16. This bonding can be accomplished by using any materials and methods known in this field.

Figure 4C:
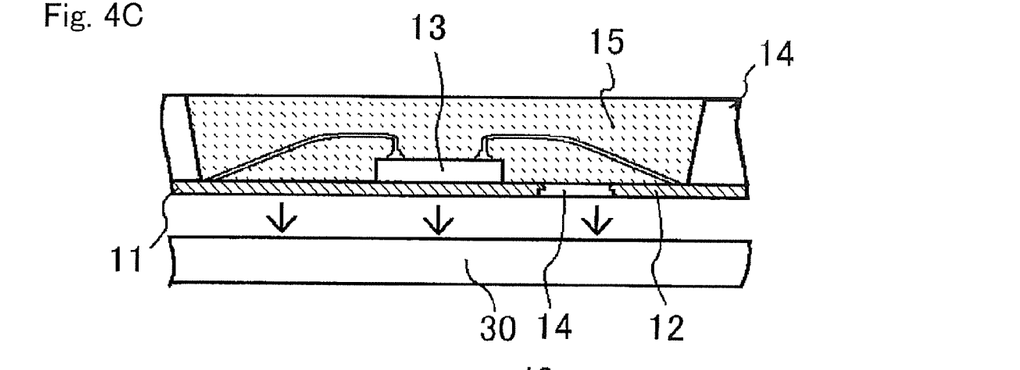

Next, as shown in FIG. 4C, the translucent covering resin 15 is formed by a known method, such as transfer molding, potting, or printing, so as to cover the light emitting element 13, the conductive wires 16, and so forth.

The translucent covering resin 15 is provided at substantially the same height as the sealing resin 14, but may be formed so as to be shorter or taller than the protruding members. The upper face may thus be a flat face, or the center may be a curved surface that is recessed or protruding.

After the translucent covering resin 15 is cured, the support substrate 30 is peeled away as shown in FIG. 4C. This peeling of the support substrate may also be performed prior to the placement of the light emitting element 13.

Figure 4D:
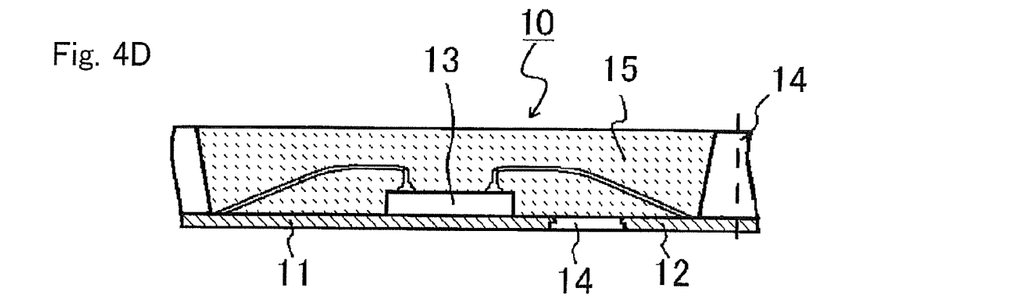

A grouping (not shown) of the semiconductor package shown in FIG. 4D can be obtained by the above procedure. Finally, the grouping is broken up into individual semiconductor packages by cutting at the broken line shown in FIG. 4D, that is, so as to cut the sealing resin 14, allowing the semiconductor package 10 shown in FIG. 2A to be obtained.

The method for obtaining the individual semiconductor packages can be dicing with a blade, dicing with a laser beam, or any of various other known methods.

When semiconductor packages are thus manufactured by a series of steps in which the support substrate is used to form the first and second conduction members 11 and 12, after which the support substrate is removed, the yield can be dramatically raised, and the product can be made much smaller and lighter, than when the lead shape is modified so that the leads stick out horizontally or are bent.

Mounting Board 20

The mounting board 20 is usually called a printed board, a wiring board, etc., and can be any type that is known in this field, as long as it is a board that has a conductive pattern as wiring on the surface of an insulating board made of plastic, ceramic, etc., or optionally in the interior.

As shown in FIGS. 1A and 1B, the mounting board 20 comprises at least first and second wiring components 21 and 22 on the surface.

Figures 5A, 5B:
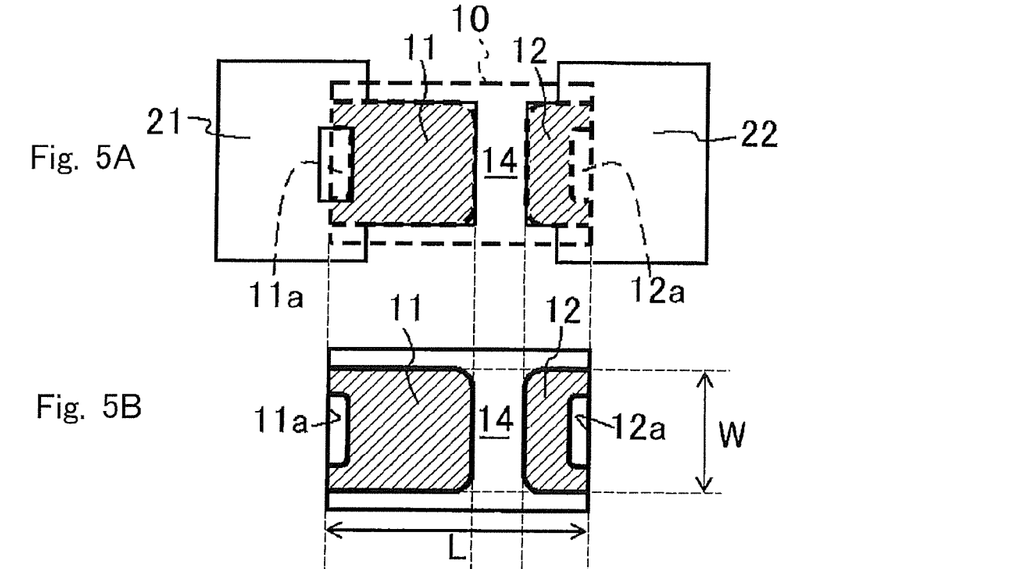
FIG. 5 is a plan view illustrating the layout of the wiring of the mounting board and how the mounting board and the semiconductor package of the present invention are connected.

The first and second wiring components 21 and 22 are respectively connected to the first and second conduction members 11 and 12 of the above-mentioned semiconductor package 10, and as shown in FIG. 5A, the first wiring component 21 of a mounting board (not shown) is joined to the first conduction member 11 of the semiconductor package 10, and the second wiring component 22 is joined to the second conduction member 12.

Figure 5C:
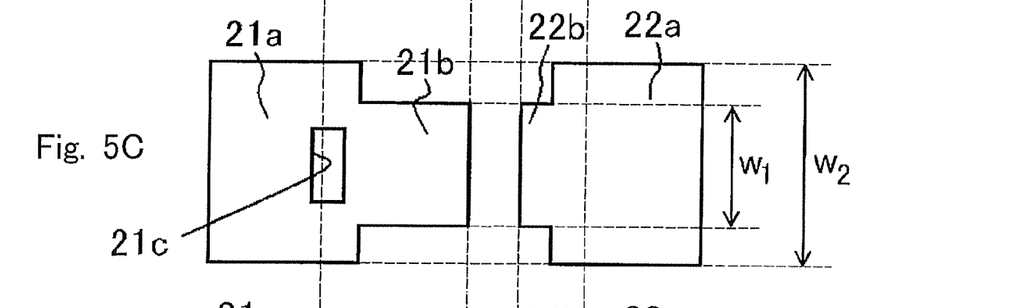

As shown in FIG. 5C, the first wiring component 21 comprises a narrow part 21b covered by the first conduction member 11 of the semiconductor package, and a wide part 21a that extends away from the first conduction member 11 (in the lengthwise direction, such as the L direction in FIG. 5B) and is wider than the narrow part 21b. Similarly, the second wiring component 22 comprises a narrow part 22b covered by the second conduction member 12 of the semiconductor package, and a wide part 22a that extends away from the second conduction member 12 and is wider than the narrow part 22b. The narrow parts 21b and 22b of the first and second wiring components 21 and 22 are disposed so as to be opposite each other.

The wide parts 21a and 22a of the first and second wiring components 21 and 22 may have different widths, but are preferably the same width. The reason for this is to correspond to the fact that the first and second conduction members 11 and 12 of the semiconductor package are usually formed in the same width (such as W in FIG. 5B). Therefore, if the first and second conduction members of the semiconductor package have different widths, the first and second wiring components may have correspondingly different widths.

For example, the width (w2 in FIG. 5C) of the wide parts 21a and 22a of the first and second wiring components 21 and 22 may be about the same as the width of the semiconductor package, but is preferably greater than the width of the semiconductor package, and more specifically, is favorably about 0 to 30% greater than the width of the semiconductor package, and especially about 5 to 20% greater.

The width (w1 in FIG. 5C) of the narrow parts 21b and 22b of the first and second wiring components 21 and 22 is preferably less than the width of the semiconductor package. For example, it is favorably about 5 to 20% less than the width of the semiconductor package. It may be the same as, or less than, the width (W in FIG. 5B) of the first and second conduction members of the semiconductor package, but it is preferably the same as the width of the first and second conduction members.

The length (l11 and l12 in FIG. 5D) of the narrow parts 21a and 21b of the first and second wiring components 21 and 22 may vary according to the size of the first and second conduction members 11 and 12 of the corresponding semiconductor package, but is preferably the same. There are no particular restrictions on this length, but it is favorable, for example, for it to be set to a range of about ±50% of the length of the first conduction member 11 of the semiconductor package. Excess solder, which is the joining member between the first and second conduction members and the first and second wiring components (discussed below), can be puddled in this portion, which reduces variance in the amount of solder directly under the semiconductor package, and allows the semiconductor package to be mounted horizontally, that is, parallel to the mounting board surface.

It is favorable if the length (l11 and l12 in FIG. 5D) of the narrow parts 21a and 21b of the first wiring component 21 and the second wiring component 22 differs according to the size of the first conduction member 11 and second conduction member 12 of the corresponding semiconductor package. This size difference may vary within a range of about ±30% of the ratio of the surface area of the first conduction member 11 of the corresponding semiconductor package to the surface area of the second conduction member 12. From another standpoint, examples of the ratio of the length of the narrow part of the first wiring component to the length of the narrow part of the second wiring component include about 1.5 to 5:1, and about 2 to 3.5:1. It is particularly favorable for the length of the narrow part of the first wiring component and the length of the narrow part of the second wiring component to be set such that the end in the lengthwise direction (L in FIG. 5B) on the inside of the first and second conduction members of the semiconductor package coincides with the end on the inside of the narrow part.

Because this ensures the maximum contact surface area between the first and second conduction members and the first and second wiring components, good adhesion can be obtained between the two, the degree of variance in the amount of solder used in joining the two can be kept to a minimum, and better horizontality can be ensured.

Also, since the maximum contact surface area can be ensured between the first and second conduction members and the first and second wiring components, heat dissipation is further enhanced.

Figure 6A:
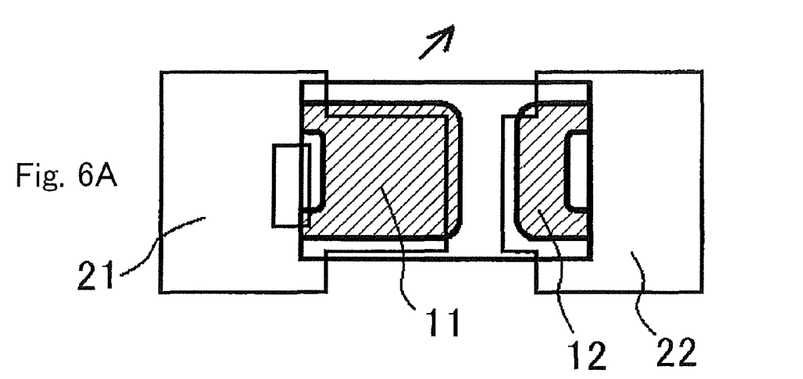
FIG. 6 is a simplified diagram illustrating misalignment of the light emitting device of the present invention.
Figure 6B:
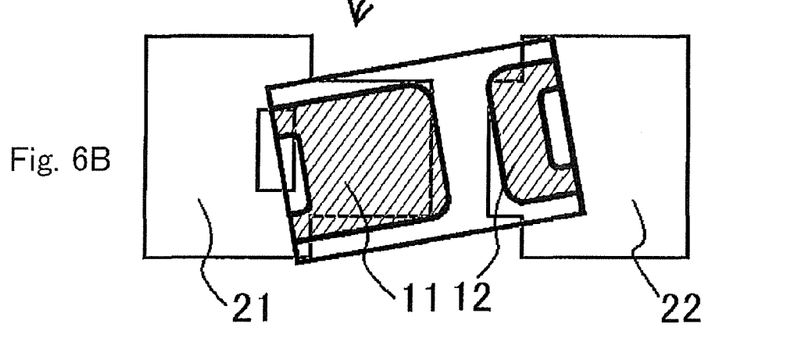

Furthermore, by increasing the contact surface area between the first and second conduction members, not only the first and second wiring components result in better horizontality as mentioned above, but it also prevents misalignment of the semiconductor package at the mounting board surface, that is, deviation in the direction of the arrow in FIG. 6A, tilting or rotation in the direction of the arrow in FIG. 6B, etc.

Figure 7:
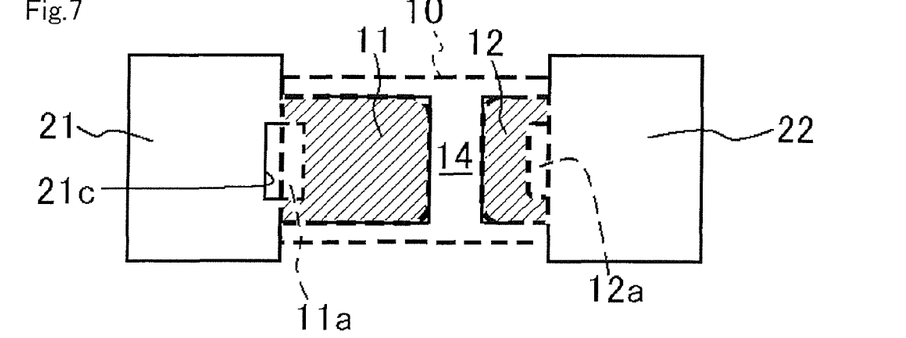
FIG. 7 is a plan view illustrating the layout of the wiring of the mounting board and how the mounting board and the semiconductor package of the present invention are connected.

The boundary portion between the narrow part and the wide part of the first wiring component 21 and the second wiring component 22 may coincide with the side face of the semiconductor package (see FIG. 7).

As shown in FIG. 5C, the first wiring component 21 comprises a recess 21c in its interior, and more particularly, in the center region of the width direction. This recess 21c can be formed in the region nearing the narrow part 21b, toward the wide part 21a side, to the extent that the entire recess 21c is present in the wide part 21a. If the cut-outs 11a and 12a are made in the side faces of the first and second conduction members 11 and 12 of the semiconductor package, for example, the recess 21c is preferably disposed at a corresponding position. Also, part of the wide part 21a is preferably disposed at a position where it sticks out from directly under the semiconductor package. This makes it possible for just the required amount of excess solder or the like that may be disposed directly under the semiconductor device to escape through the cut-out 11a and the recess 21c.

There are no particular restrictions on the width (w13 in FIG. 5D) and the length (l13 in FIG. 5D) of this recess, which can be adjusted as desired. For example, the width may be about at least 20% and no more than 70% of the width of the wide part, and the length may be about at least 10% and no more than 50% of the length of the wide part. As to the depth, it may pass all the way through the first wiring component, or it may be at least about 50% of the thickness of the first wiring component.

Figure 5D:
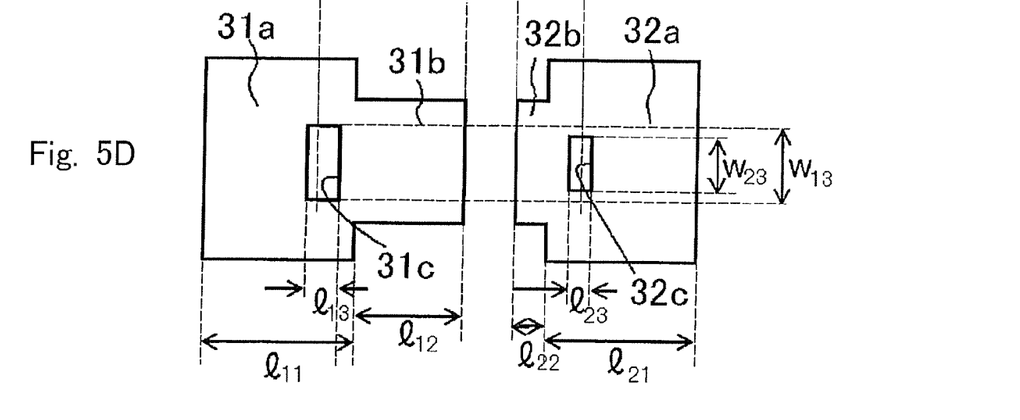

As shown in FIG. 5D, a recess 32c is favorably formed in the interior of the second wiring component 32, and more particularly, in the center region of the width direction. This recess 32c is favorably formed in the region nearing the narrow part 32b, toward the wide part 32a side, to the extent that the entire recess 32c is present in the wide part 32a.

There are no particular restrictions on the width (w23 in FIG. 5D) and the length (l23 in FIG. 5D) of this recess 32c, which can be adjusted as desired. For example, the width may be about at least 20% and no more than 70% of the width of the wide part, and the length may be about at least 10% and no more than 30% of the length of the wide part. As to the depth, it may pass all the way through the first wiring component, or it may be at least about 50% of the thickness of the first wiring component.

This recess 32c may have the same width, length and/or depth as a recess 31c in the first wiring component, so long as its volume is smaller. This difference in volume is, for example, such that the ratio of the recess 31c to the recess 32c is about 0.4 to 0.7:1.

Figure 8A:
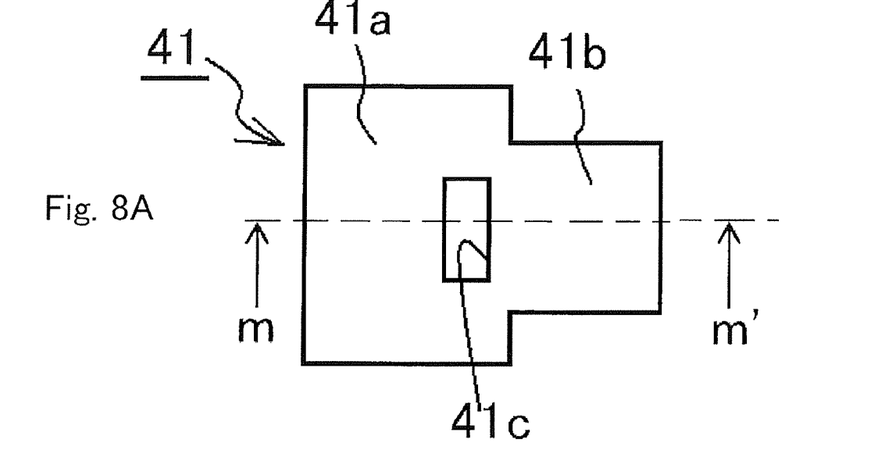
FIG. 8 is a cross section illustrating the shape of the recess in the wiring component of the mounting board of the present invention.
Figure 8B:
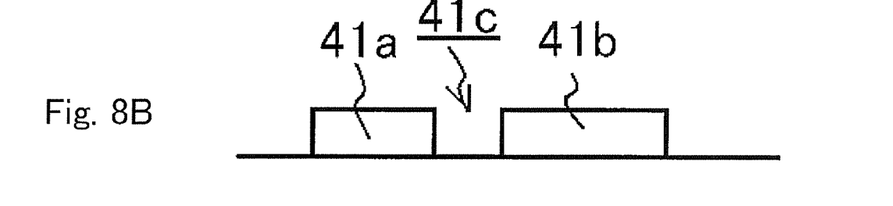
Figure 8C:
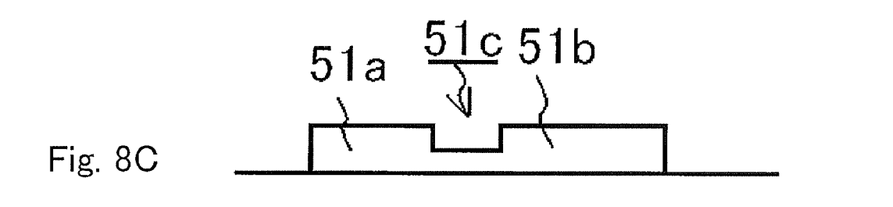

As shown in FIG. 8A, a recess 41c formed between the wide part 41a and the narrow part 41b in the wiring component 41, such as the first wiring component and the second wiring component, may be in the form of a through-hole that passes through the wiring component 41 as shown in FIG. 8B, for example, or a recess 51c formed between the wide part 51a and the narrow part 51b may be a depression having a bottom made of the wiring component material as shown in FIG. 8B.

Therefore, the depth of the recess may be equal to or less than the thickness of the wiring component.

Figure 8D:
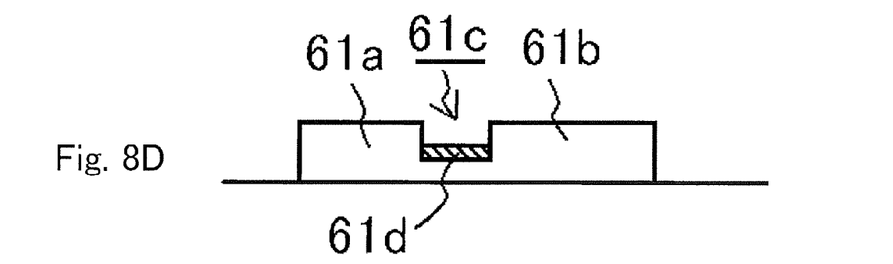

When the recess is in the form of a depression, as shown in FIG. 8D, an insulator layer 61d may be disposed at least on the bottom of a recess 61c formed between the wide part 61a and the narrow part 61b.

The thickness of the insulator layer 61d is preferably less than the depth of the depression. That is, a preferable state is one in which the insulator layer 61d is not embedded in the entire depth direction of the depression.

The insulator layer 61d may be $SiO_2$, SiN, or another such oxide, nitride, or the like, or it may be an insulating material such as the above-mentioned plastic or a ceramic that makes up the mounting board.

Forming these recesses allows excess solder to temporarily puddle inside the recesses 21c and 31c and/or the recess 32c, and promotes escape of excess solder to the side of the wide parts 21a and 31a and/or 32a when solder is reflowed over the first wiring components 21 and 31 and/or the second wiring components 22 and 32. Consequently, the surface tension of the solder is utilized to temporarily lessen the rise of the solder level between the narrow part and the wide part, or in other words, the build-up of solder between the wide part and the narrow part is linked via the recesses so that the amount of solder on the narrow part is less than the amount of solder on the wide part, and as a result a relatively small quantity of solder according to the surface area of the narrow parts 21b and 31b and/or 32b is uniformly present at these places, so horizontal mounting of the semiconductor package can be carried out with no misalignment.

In particular, as shown in FIG. 5D, when a recess is formed near the narrow part, the extent of the above-mentioned puddling and escape of excess solder will be less than that at the first wiring component, and this better ensures the horizontal mounting of the semiconductor package without any misalignment.

The side face of the semiconductor package 10 is preferably disposed above the recess 31c in the first wiring component and, if desired, above the recess 32c in the second wiring component (see FIG. 5A), and if, as mentioned above, the cut-outs 11a and 12a are made in the side faces of the first and second conduction members 11 and 12 in the semiconductor package 10, it is preferable if at least the cut-out 11a is disposed so as to partially overlap the recess 31c in the first wiring component (see FIG. 5A).

With this layout, puddling and escape of the above-mentioned excess solder or other joining member can be more effectively realized by utilizing the cut-outs and recesses.

The first and second wiring components are usually patterned into the desired shape by using copper or another conductive material, for example.

The joining member (discussed below) is disposed as part of the wiring components or on the surface thereof. There are no particular restrictions on the thickness of the wiring components and joining members, and can be suitably adjusted according to the material thereof and the intended application and performance.

Joining Member

With the light emitting device used in the present invention, the first and second conduction members of the semiconductor package and the first and second wiring components of the mounting board are connected by joining members as discussed above.

When the heat dissipation of the semiconductor package is taken into account, this joining member is preferably a conductive joining member with good heat dispersion properties.

A conductive paste of silver, gold, palladium, or the like, a eutectic solder such as Au—Sn, a braze of a low-melting point metal, or the like can be used as the conductive joining member.

These joining members are usually disposed in substantially the same shape on the uppermost face of the wiring components of the mounting board.

As to the method for joining the semiconductor package and the mounting board with the joining member, first the entire mounting board is heated and the joining member is reflowed. After this, the semiconductor package equipped with a conductive member is placed on the wiring components on which the joining member has been reflowed, and this product is cooled. When the semiconductor package is put in place, the weight of the semiconductor package causes any excess joining member to flow into the wide part and/or recess in the wiring component, the proper amount of joining member is disposed uniformly and directly under the semiconductor package, excess joining member does not flow to the semiconductor package, there is no rotation, tilting, or misalignment, and the semiconductor package can be horizontally joined to the mounting board surface.

The light emitting device of the present invention is particularly effective in the joining of a mounting board and a semiconductor package that are compact and lightweight, but can be applied to any kind of semiconductor package and mounting board, and furthermore, it can be utilized in a wide range of applications, to not just semiconductor packages, but also to the mounting of various kinds of device, such as memories and other semiconductor devices and mounted parts and so forth.

DESCRIPTION OF THE NUMERALS

10; semiconductor package: 10b; bottom face of semiconductor package: 11; first conduction member: 11a; cut-out: 12; second conduction member: 12a; cut-out: 13; light emitting element: 14; sealing member: 15; translucent covering resin: 16; conductive wire: 20; mounting board: 21; first wiring component: 21a, 31a, 41a, 51a, 61a; wide part: 21b, 31b, 41b, 51b, 61b; narrow part: 21c, 31c, 41c, 51c, 61c; recess: 22; second wiring component: 22a, 32a; wide part: 22b, 32b; narrow part: 32c; recess: 30; support substrate: 31; second protective film (resist): 32; mask: 41; wiring part: 61d; insulating layer: K; opening: X, protruding part.

The invention claimed is:

1. A light emitting device comprising:
a semiconductor package including:
a light emitting element,
a first conduction member, on one side of which the light emitting element is placed, and
a second conduction member whose surface area is smaller than that of the first conduction member, the other side of the first conduction member and the second conduction member, on the opposite side from said one side, forms a lower face of the semiconductor package; and a mounting board connected with the semiconductor package by a joining member, the mounting board including a first wiring component including a narrow part and a wide part wider than the narrow part and extending away from the first conduction member, at least the narrow part of the first wiring component being joined to the first conduction member, and the first wiring component having a recess in its interior, a second wiring component including a narrow part and a wide part wider than the narrow part and extending away from the second conduction member, at least the narrow part of the second wiring component being joined to the second conduction member.

2. The semiconductor device according to claim 1, wherein the recess is formed in the wide part of the first wiring component at a position adjacent to the narrow part and in a center region with respect to a width direction.

3. The semiconductor device according to claim 1, wherein the recess is formed in the wide part of the first wiring component as a through-hole that passes through the first wiring component.

4. The semiconductor device according to claim 1, further comprising
an insulator layer disposed on a bottom of the recess formed in the first wiring component.

5. The semiconductor device according to claim 1, wherein the semiconductor package has the light emitting element and a sealing member that covers at least one side of the first conduction member and the second conduction member, and the one side and the other side of the first conduction member and second conduction member are exposed from the sealing member only at the lower face of the semiconductor package.

6. The semiconductor device according to claim 1, wherein each of the first conduction member and second conduction member has a cut-out such that a part of one end of the cut-out coincides with a side face of the semiconductor package, and the other part of the one end of the cut-out is disposed to an inside of the side face of the semiconductor package.

7. The semiconductor device according to claim 1, wherein a width of the narrow part of the first wiring component and a width of the narrow part of the second wiring component of the mounting board are less than a width of the semiconductor package, and a width of the wide part of the first wiring component and a width of the narrow part of the second wiring component are greater than the width of the semiconductor package.

8. The semiconductor device according to claim 1, wherein a width of the narrow part of the first wiring component and a width of the narrow part of the second wiring component of the mounting board are the same or less than a width of the first and second conductive members of the semiconductor package.

9. The semiconductor device according to claim 1, wherein a recess is formed in an interior of the second wiring component of the mounting board.

10. The semiconductor device according to claim 9, wherein
the recess is formed in the interior of the second wiring component as a through-hole that passes through the second wiring component.

11. The semiconductor device according to claim 10, further comprising
an insulator layer disposed on a bottom of the recess formed in the second wiring component.

12. The semiconductor device according to claim 9, wherein
a volume of the recess formed in the first wiring component of the mounting board is larger than a volume of the recess formed in the second wiring component.

13. The semiconductor device according to claim 1, wherein
a side face of the semiconductor package is disposed above the recess in the first wiring component.

14. The semiconductor device according to claim 1, wherein
the first and second conduction members are composed of plating films.

15. The semiconductor device according to claim 1, wherein
a thickness of each of the first and second conduction members is 0.5 mm or less.

* * * * *